(12) United States Patent
Danziger

(10) Patent No.: US 7,955,697 B2
(45) Date of Patent: Jun. 7, 2011

(54) ADHESIVE BOND AND METHOD FOR THE PRODUCTION THEREOF

(75) Inventor: Manfred Danziger, Ditfurt (DE)

(73) Assignee: Ionen Strahltechnologie GmbH, Ditfurt (DE)

( * ) Notice: Subject to any disclaimer, the term of this patent is extended or adjusted under 35 U.S.C. 154(b) by 1032 days.

(21) Appl. No.: 10/589,293

(22) PCT Filed: Mar. 1, 2005

(86) PCT No.: PCT/DE2005/000422
§ 371 (c)(1),
(2), (4) Date: Apr. 27, 2007

(87) PCT Pub. No.: WO2005/084940
PCT Pub. Date: Sep. 15, 2005

(65) Prior Publication Data
US 2008/0035266 A1    Feb. 14, 2008

(30) Foreign Application Priority Data

Mar. 2, 2004   (DE) .......................... 10 2004 011 567

(51) Int. Cl.
B32B 5/00    (2006.01)
B32B 27/00   (2006.01)
B32B 33/00   (2006.01)

(52) U.S. Cl. ...................... 428/336; 428/411.1; 428/421

(58) Field of Classification Search ........................ None
See application file for complete search history.

(56) References Cited

U.S. PATENT DOCUMENTS 4,199,650 A    4/1980  Mirtich et al.

(Continued)

FOREIGN PATENT DOCUMENTS

DE    19817388    10/1999

(Continued)

OTHER PUBLICATIONS

Database WPI, Section Ch, Week 199122, Derwent Publications Ltd., London, GB; AN 1991-161215 XP002332108 & JP 03 097861 A (Matsushita Elec Ind Co Ltd) Apr. 23, 1991 abstract.

(Continued)

*Primary Examiner* — Ramsey Zacharia
(74) *Attorney, Agent, or Firm* — Norris McLaughlin & Marcus, PA; Christa Hildebrand, Esq.

(57) ABSTRACT

The invention relates to an adhesive bond of a substrate material (1), whose surface and surface-near solid area contain polymer compounds with low active surface energy, and another material (4) and a method for the production of a corresponding adhesive bond. The invention more particularly relates to an adhesive metallized fluoropolymer, such as polytetrafluoroethylene (PTFE), as a base material for printed circuit boards having a very high structural density (fine and very fine printed circuit boards) used in the GHz range and to a method for adhesive metallization of a corresponding fluoropolymer. According to the invention, the adhesive bond is formed by a nanostructured transition area (6), containing nanocomposites, between the substrate material (1) and the other material (4), inside which the substrate material (4) which is nanostructured changes into the other material (4). The nanocomposites are composed of substrate material (1) and the other material (4). The material parts of the nanocomposites change from the substrate material (1) in the direction of the other material (1), starting with predominantly substrate material which becomes predominantly the other material (4). According to the invention, the adhesive bond is produced by physically and/or chemically exciting a nanoindented surface of the substrate material (1) and by applying the other material (4) in the form of particles during the excited state until the surface of the other substrate material (1) is fully coated with the other material (4).

12 Claims, 4 Drawing Sheets

U.S. PATENT DOCUMENTS 4,390,567 A * 6/1983 Liepins .................. 427/214
6,342,307 B1 1/2002 Menezes et al.

FOREIGN PATENT DOCUMENTS

| DE | 10163437 | 7/2003 |
|---|---|---|
| EP | 0 502 633 A | 9/1992 |
| GB | 816641 | 7/1959 |
| WO | WO0242514 | 5/2002 |
| WO | WO2004015161 | 2/2004 |

OTHER PUBLICATIONS

Kupfer H et al: "Plasma and ion beam assisted metallization of polymers and their application" Nuclear Instruments & Methods in Physics Research, Section-B: Beam Interactions with Materials and Atoms, North-Holland Publishing Company. Amsterdam, NL, vol. 166-167, May 2000,pp. 722-731, XP004204165, ISSN: 0168-583X—abstract p. 723, right-hand column, line 10—p. 724, left-hand column, last line; figures; table 1 p. 724, right-hand column, paragraph 3.1.

Ratchev B A et al: "Ion beam modification of metal-polymer interfaces for improved adhesion" Nuclear Instruments & Methods in Physics Research, Section-B: Beam Interactions With Materials and Atoms, North-Holland Publishing Company. Amsterdam, NL, vol. 106, No. 1, Dec. 1995, pp. 68-73, XP004001787 ISSN: 0168-583X—the whole document.

Anonymous: "Improved metal/polymer adhesion durability by ion beam modification" Research Disclosure, Kenneth Mason Publications, Westbourne, GB, vol. 339, No. 42, Jul. 1992 XP007117903 ISSN: 0374-4353 the whole document.

Chin-An Chang,J.E.E. Baglin,A.G.Schrott ,K.C.Lin: "Enhanced Cu-Teflon adhesion by presputtering prior to the Cu deposition" Applied Physics Letters, vol. 51,No. 2,Jul. 13, 1987, pp. 103-105, XP002332106 p. 103, left-hand column, line F-p. 105, right-hand column, last line; figures.

Baglin J E E: "Interface Tailoring for Adhesion Using Ion Beams" Nuclear Instruments & Methods in Physicsresearch, Section-B: Beam InteractionsWith Materials and Atoms, North-Hollandpublishing Company. Amsterdam, NL,vol. B39, No. 1-4 Index, Mar. 2, 1989, pp. 764-768, XP000111163 ISSN: O168-583X abstract; figures figures, the whole document.

Perry C C et al: "Reactivity of Cu with poly (tetrafluoroethylene) and poly(vinyl chloride): Effect of pre- and post-metallization modification on the metal/polymer interface" Journal of Vacuum Science and Technology A. Vacuum, Surfaces and Films, American Institute of Physics, New York, NY, US, vol. 20,No. 5, Sep. 2002, pp. 1690-1698, XP012006183 ISSN:0734-2101 p. 1693, left-hand column, paragraph 2-p. 1694, left-hand column, paragraph 1; figures * B. Reactivity of Copper on PTFE*.

Bertrand P. et al: "Polymer metallization: Low energy ion beam surface modification to improve adhesion" Nuclear Instruments & Methods in Physics Research, Section-B: Beam InteractionsWith Materials and Atoms, North-Hollandpublishing Company. Amsterdam, NL, vol. 131, No. 1-4, Aug. 1997, pp. 71-78, XP004100503 ISSN: 0168-583X the whole document.

N.Capps, L. Lou, M. Amann: "Application Note: Ion Source Applications: Polymer Surface Modification" 'Online!2000, XP002332107 Retrieved from the Internet: URL: http://www.advanced-energy.com/upload/ app_4a_3.pdf> retrieved on Jun. 15, 2005! Advanced Energy Industries, Inc. the whole document.

* cited by examiner

ADHESIVE BOND AND METHOD FOR THE PRODUCTION THEREOF

This is a 371 of PCT/DE2005/000422 filed Mar. 1, 2005, claiming priority of DE 10 2004 011 567.2 of Mar. 2, 2004.

BACKGROUND OF THE INVENTION

The invention relates to an adhesive bond between a substrate material whose surface and solid region proximate to the surface have polymer compounds with a low active surface energy, and another material, as well as a method for producing a corresponding adhesive bond. In particular, the invention relates to a metallized adhesive fluoropolymer, such as polytetrafluoroethylene (PTFE) as a base material (substrate material) for printed circuit boards with a high structural density (finely and very finely patterned printed circuit boards) for applications in the GHz frequency range and to a method for adhesive metallization of a corresponding fluoropolymer.

An adhesive bond between two different materials, for example between a substrate material and another material, is absolutely necessary for a large number of technical applications of corresponding adhesive bonding materials. For example, the adhesive metallization of surfaces of a polymer material with extremely favorable dielectric properties (small dielectric constant $\in_{rel}$ and small dielectric loss tan δ) are an essential prerequisite for the production of high-quality printed circuit boards with a high structural density operating at frequencies above 1 GHz. To minimize electrical losses, in particular on printed circuit boards with very narrow conductor tracks, the surfaces of the metallic conductor tracks must be very smooth. This means that the adhesive bond between the fluoropolymer as the substrate material and the metallic conductor tracks must be implemented without severely roughening the substrate material. Similar requirements apply to materials for the production of low loss electric capacitors.

GB 816641 discloses a method for metallizing a PTFE surface, whereby the PTFE surface is initially treated with sodium dissolved in liquid ammonia, followed by the deposition on the PTFE surface of a nickel layer produced from a solution of a nickel salt and sodium hypophosphite. The nickel layer forms the base for the deposition of another metal layer.

DE 198 17 388 A1 also describes a solution where the smooth surface of a fluoropolymer is initially cleaned and etched by a corona discharge process, with the process being performed at an operating pressure in a range of 10 Pa ($10^{-1}$ mbar) to 1,500 Pa (15 mbar). The pre-treatment conditions are adjusted so as to produce a very smooth substrate surface. It has been observed with this type of corona discharge that a very smooth surface can be formed with an oxygen/tetrafluoromethane-mixture after the initial etch step. A first metal layer containing nickel is deposited on this activated surface by decomposition of volatile nickel compounds, and a second metal layer is subsequently deposited on the nickel layer from a metallizing bath. According to statements by the applicant, a polymer/metal composite formed in this manner has a surprisingly high bond strength. Both solutions have the disadvantage that essentially a nickel layer has to be deposited first on the surface of the fluoropolymer. The adhesive strength of the produced composite is also insufficient for many technical applications.

A similar approach is disclosed in DE 101 63 437 A1. However, the cleaning step and the initial etch step are performed in a vacuum chamber at an operating pressure of 0.6 Pa ($6 \times 10^{-3}$ mbar). The surface is likewise coated with carbon at 0.6 Pa, whereby the coating is performed by HF cathode sputtering. The produced sandwich construction is subsequently processed in several processing steps and is then adhesively bonded to a metal. It is stated in DE 101 63 437 A1 that the adhesive bond produced in this manner could not be broken. Disadvantageously, however, an additional material has to be deposited first. It should also be noted that the high bond strength claimed in the application could generally not be confirmed.

U.S. Pat. No. 6,342,307 B1 also describes a method for producing an adhesive bond between a metal layer and a polymer surface. This method includes the following substantial process steps:

1. A metal is deposited on the surface of the polymer without forming a continuous metal layer; instead, deposits in the form of metal particles with dimensions in the range from 5 to 20 nm are formed. The processing conditions are selected so as to have no effect on the polymer surface (temperature below the glass transition temperature).

2. The polymer surface is then heated to a temperature above the glass transition temperature, and the particles are incorporated into the surface layer of the polymer so as to be embedded in the polymer at least halfway, but not completely. After a cool-down, the particles protruding from the polymer surface are firmly anchored in the surface.

3. Thereafter, metal is again deposited onto the surface prepared in this manner, whereby the process is carried out so as to form a continuous metal layer. The added metal bonds with the metal particles protruding from the surface of the polymer, whereby the particles which are firmly embedded in the polymer produce a metal layer which is firmly anchored on the polymer surface.

Care has to be taken in all process steps that the metal is deposited without undergoing a chemical change. In particular, care has to be taken that the metal is not oxidized. In the process described in U.S. Pat. No. 6,342,307 B1, a positively locked bond is formed between the metal and the polymer in addition to the adhesion forces. Disadvantageously, embedding metal particles in the polymer causes the side of the metal layer facing the polymer to be highly structured. It is also known to expose bumpers made from polymers to an air plasma before applying paint to produce a durable paint coat, whereby the coating becomes particularly durable due to the increased surface energy of the plastic (Herold, Dr., Martin, Modifikation von Festkörperoberflächen und ihre Charakterisierung durch Ellipsometrie, Dissertation Universität Tübingen, 2001—Herold, Dr., Martin, *Modification of solid surfaces and their characterization by ellipsometry*, Dissertation University Tübingen, 2001). However, the described solution is capable of producing an adhesive bond in only limited applications.

The invention addresses the problem of providing an adhesive bond between a substrate material, whose surface and solid region proximate to the surface include polymer compounds with a low active surface energy, and another material, as well as providing a method for producing a corresponding adhesive bond, so as to overcome the disadvantages of the present state-of-the-art.

BRIEF SUMMARY OR THE INVENTION

The problem is solved by the invention by a bond between a substrate material having a surface and a solid region proximate to the surface comprised of polymer compounds with a low active surface energy, and another material, wherein a nano-structured transition region comprising nano-composites is formed between the connected materials, in such a way that this region has a layer thickness between 20 nm and 20 μm and is predominantly formed of nano-composites. The ratio of substrate material to an other material in a direction transverse to the transition region changes from predominantly substrate material in the immediate vicinity of the substrate material to predominantly the other material in the immediate vicinity of the other material, with the substrate material transitioning into the other material with a nano-structure. Further, the problem is solved by a method Dependent claims describe advantageous embodiments of the adhesive bond, and advantageous embodiments of the method for producing the adhesive bond.

It has been observed that a bond between a substrate material, whose surface and the solid region proximate to the surface have polymer compounds with a low active surface energy, such as fluoropolymers, and another material, for example a metal, attains a particularly high bond strength if the substrate material transitions into the other material with a nano-structure, wherein this transition occurs via nano-composites which are formed of the substrate material and the other material, and wherein the material fractions of the metal composites transition from the substrate material towards the other material from initially predominantly substrate material to predominantly the other material. The substrate material therefore changes over to the other material within a nano-structured transition region. A nano-structure is defined as a structure in the nanometer range, i.e., the existence of structural elements having dimensions, such a length, width, height, diameter, in the nanometer range, whereby the number of atoms and/or molecules forming a structural element are smaller than in microstructures.

Such nano-structured transition region forms an interactive physical system. The structural elements of this nano-structured transition region are mainly nano-composites, whereby a nano-composite is formed by including other elements or compounds in the substrate material. In a nano-composite, materials with different properties penetrate each other over a region of a few nanometers. The fraction of both materials is almost uniform within a structural element, but changes over within the transition region formed by the structural elements (nano-composites) from the substrate material to the other material. Stated differently, nano-composites formed predominantly of substrate material are present proximate to the substrate material, followed by deposition of nano-composites with an increasingly larger fraction of the other material, until finally nano-composites predominantly of the other material are formed in the vicinity of the other material. The transition region, where the substrate material changed over into the other material with a nano-structure, thus extends over a layer thickness of several nanometers to several micrometers (20 nm to 20 μm). Depending on the properties and surface structure of the initial surface of the substrate material, the transition region can be mostly flat, but can also be severely undulated, with the waviness of the transition region corresponding to the layer thickness, i.e., from several nanometers to several micrometers. The bond strength is particularly high, if the nano-composites include metal fractions and/or metal compounds, in particular metal polymers. The adhesive strength of a composite according to the invention made of a substrate material and another material other than a metal can be further increased, for example, by arranging other nano-composites within the nano-structured transition region having the nano-composites, whereby the other nano-composites contain metal fractions and/or fractions of metal compounds, in particular metal polymers, in addition to the substrate material fractions and the fractions of the other material.

The plastic properties of the transition region can be significantly improved by disposing diamond-like components, such as nano-composites containing α-C:H, in the transition region. This is particularly important when the substrate material has permanent elasticity, as may be required, for example, for producing a flexible circuit board.

The bond formed according to the invention has an additional beneficial effect for many applications in that the nano-structured transition region with the nano-composites provides hydrophobic sealing of the surface of the substrate material.

An adhesive bond according to the invention between a substrate material having on the surface or the solid region proximate to the surface polymer compounds with a low active surface energy and another material is produced by activating, i.e., physically and/or chemically exciting, a nano-indented surface and a corresponding nano-indented solid region of the substrate material proximate to the surface, and depositing the other material, while the nano-indented surface or of the nano-indented solid region proximate to the surface remains in an energetically excited state, particle-by-particle until the polymer compounds of the substrate material with low active surface energy is continuously covered with the other material. During this process, the number of particles deposited per unit time of the other material is advantageously continuously or stepwise increased. The layer of the other material produced in this manner can be built up to the desired layer thickness using conventional methods (e.g., wet chemistry and/or electrolytic).

The nano-indented surface and the nano-indented solid region proximate to the surface is excited by ion and/or ion beam and/or plasma and/or electron beam and/or laser processes. The other material can be deposited particle-by-particle using PVD and/or CVD processes and/or cathode sputtering. The applied excitation method(s) or the applied deposition method(s) can employ any combinations of these processes. It should be noted that implementation of some of the processes requires certain technical equipment and may therefore not be locally implemented at the same time.

To achieve the physical effect, the processes must be applied in direct succession or alternatingly, so that the excitation process step and particle deposition process step affect the nano-indented surface and the nano-indented solid region proximate to the surface essentially as a uniform overall process. For example, the processes may advantageously be applied in direct temporal succession. However, this is not necessary. It is important that the effect of one process (the excitation process) is still effective when the other process (the deposition process) is applied. This is an important prerequisite for forming the nano-structured transition region with the nano-composites between the substrate material and the other material. It is also important for the adhesive bond strength that the total process is continually performed until the surface of the substrate material is completely covered with the other material, because only then is a sufficient quantity of nano-composites formed from constituents of the substrate material and the other material and, optionally, an additional fraction metal or metal compounds, in particular a metal polymer.

The nano-indentation of the surface and the solid region proximate to the surface of the substrate material represents another important aspect of the effect of the method of the invention. It is recognized that "ideal" smooth surfaces do not exist in nature and that all surfaces therefore exhibit a certain roughness. It is important for the invention, in particular in the application of the invention for producing a printed circuit board material for applications in the GHz range, to be able to produce an adhesive bond, wherein the opposing surfaces of the bonded material do not have an excessively deep roughness. To attain an adhesive bond of this type, the surface of the substrate material should be structured so as to form a nano-structured transition region with nano-composites. This is achieved by forming nano-indentations in the surface and the solid region proximate to the surface. This nano-indentation can be compared to a fractal structure encompassing geometric structural elements in the nanometer range (several hundred nanometers to several micrometers), so-called nano-cliffs. The nano-indentation is also distinguished by a relatively shallow microscopic roughness which, however, has a large ratio of surface to geometric base area. The nano-indentation of the surface has the physical effect that different mechanical, chemical, polar and therefore surface energy-related conditions exist at almost any location on the surface. This is a prerequisite for forming a nano-structured transition region containing nano-composites. For example, scanning ion beam technology and/or wet chemical processes are conventionally used to form corresponding nano-indentations on the surface and the solid region proximate to the surface between the polymer compounds and the substrate material having a low active surface energy.

BRIEF DESCRIPTION OF THE DRAWINGS

The invention and its advantageous effects will now be described with reference to the following exemplary embodiments. The corresponding drawings show in.

DETAILED DESCRIPTION OF THE INVENTION

Example 1

Adhesive Bond Between a Glass Fabric-PTFE Composite and Copper

Figure 1:
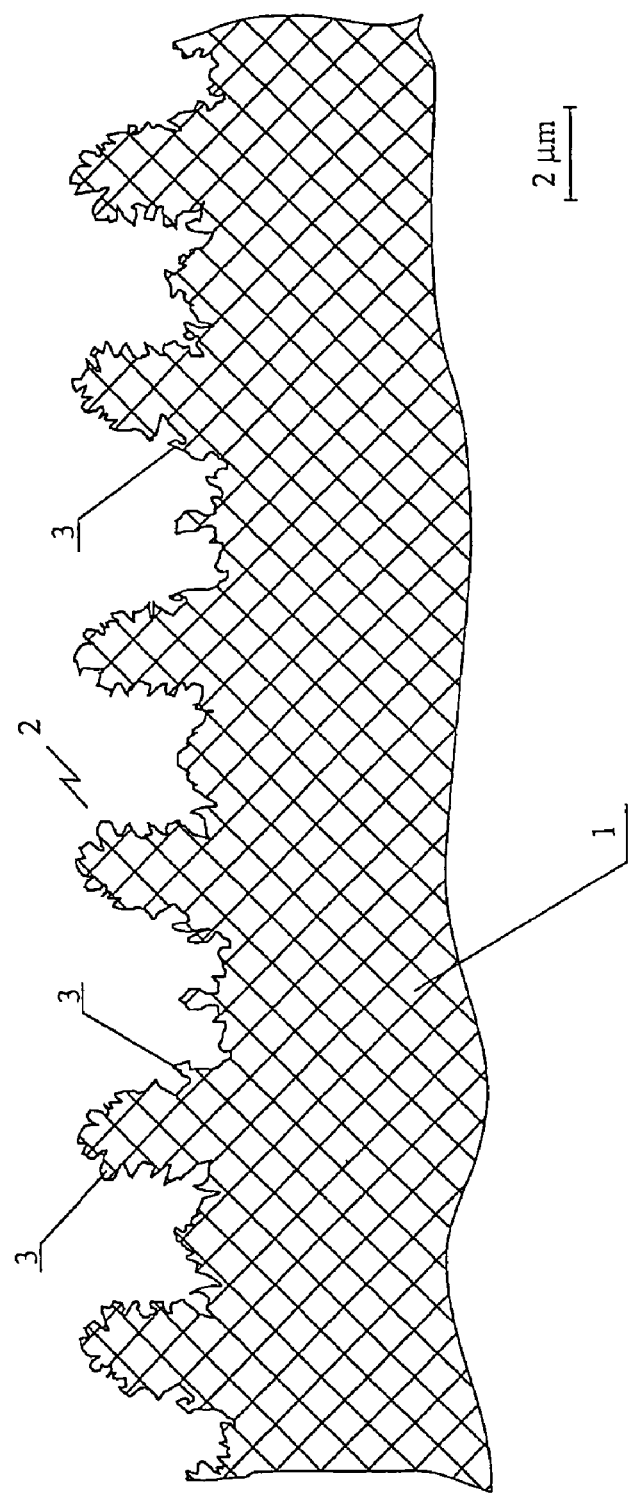
FIG. 1 a cross-section through a nano-indented surface layer.
Figure 2:
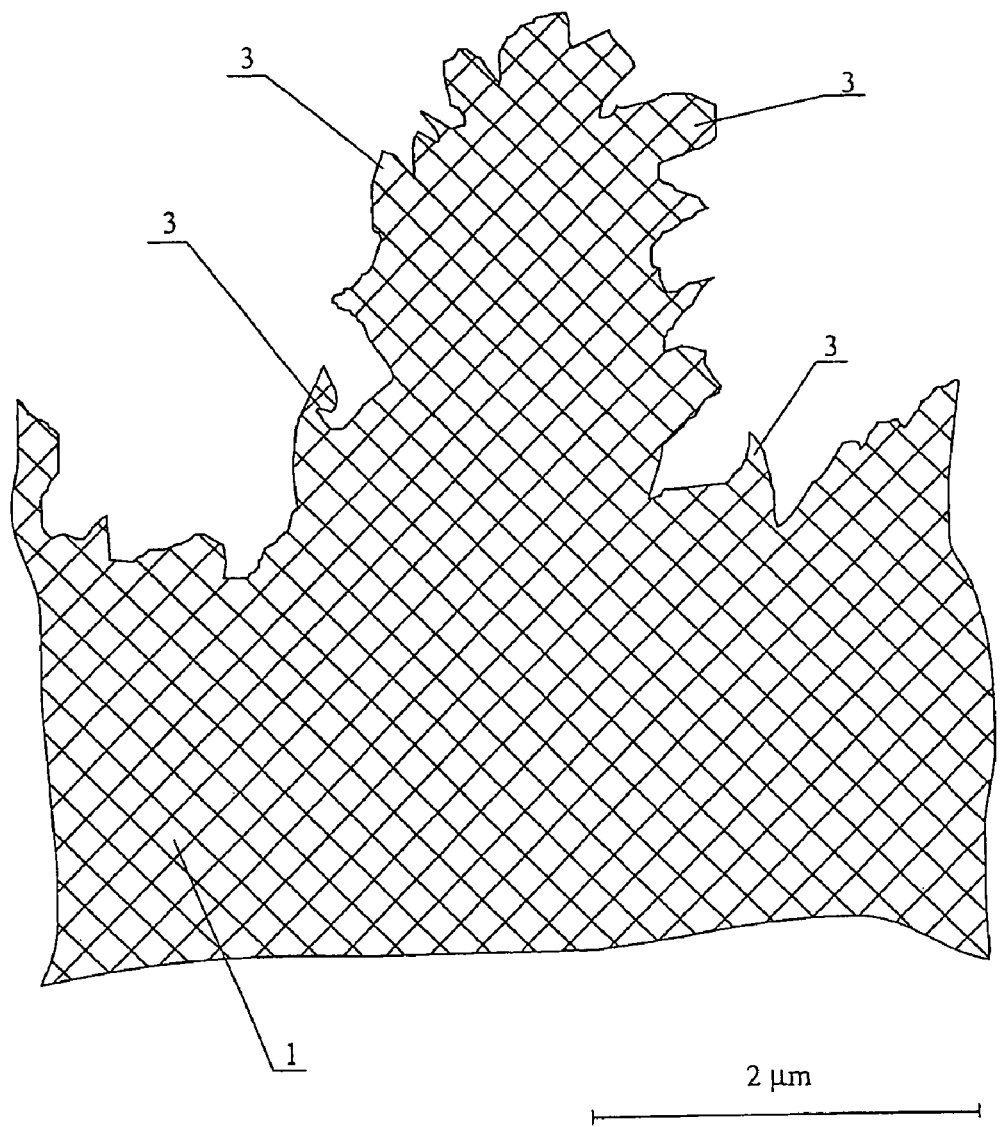
FIG. 2 a detail of the nano-indented surface layer with nano-cliffs.

A foil material 1, made of a glass fabric-PTFE composite with a PTFE surface layer having a minimum thickness of at least 20 µm, is periodically moved past an ion source in a vacuum chamber and thereby processed with a directed ion beam. The ions are accelerated with a voltage of 5 keV. The separation between the ion source and the foil surface is approximately 10 cm. Argon at a pressure of $2 \times 10^{-4}$ mbar is used as a process gas. The irradiation density is 1 mA/cm$^2$. The process is performed to attain an effective exposure time of the entire foil surface of approximately one minute. The PTFE surface layer has then a nano-indentation 2 with nano-cliffs 3 extending over an area of 2 to 6 µm, as schematically illustrated in FIG. 1 and FIG. 2, respectively. The PTFE surface layer is activated by the ion bombardment, i.e., the polymer molecules are physically and/or chemically excited. The excited nano-indented region of the PTFE surface layer is then further processed immediately, i.e., without a time delay, by depositing copper particles with a magnetron on the nano-indented PTFE surface, alternating with an additional ion bombardment of the nano-indented region 2 of the PTFE surface layer. Deposition of the copper particles by a cathode sputtering process cyclically alternates with the additional ion bombardment approximately every 3 seconds, accompanied by a stepwise increase of the number of particles, i.e., the deposition rate. Both processes therefore operate as a uniform combined process. After processing the nano-indented PTFE surface for a total effective time of approximately 20 seconds (with reference to each surface element of the PTFE surface layer) by deposition of copper particles alternating with ion bombardment, a continuous copper layer 4 is formed, which is build up afterwards to a layer thickness of between 0.3 and 1.0 µm by magnetron cathode sputtering.

Figure 3:
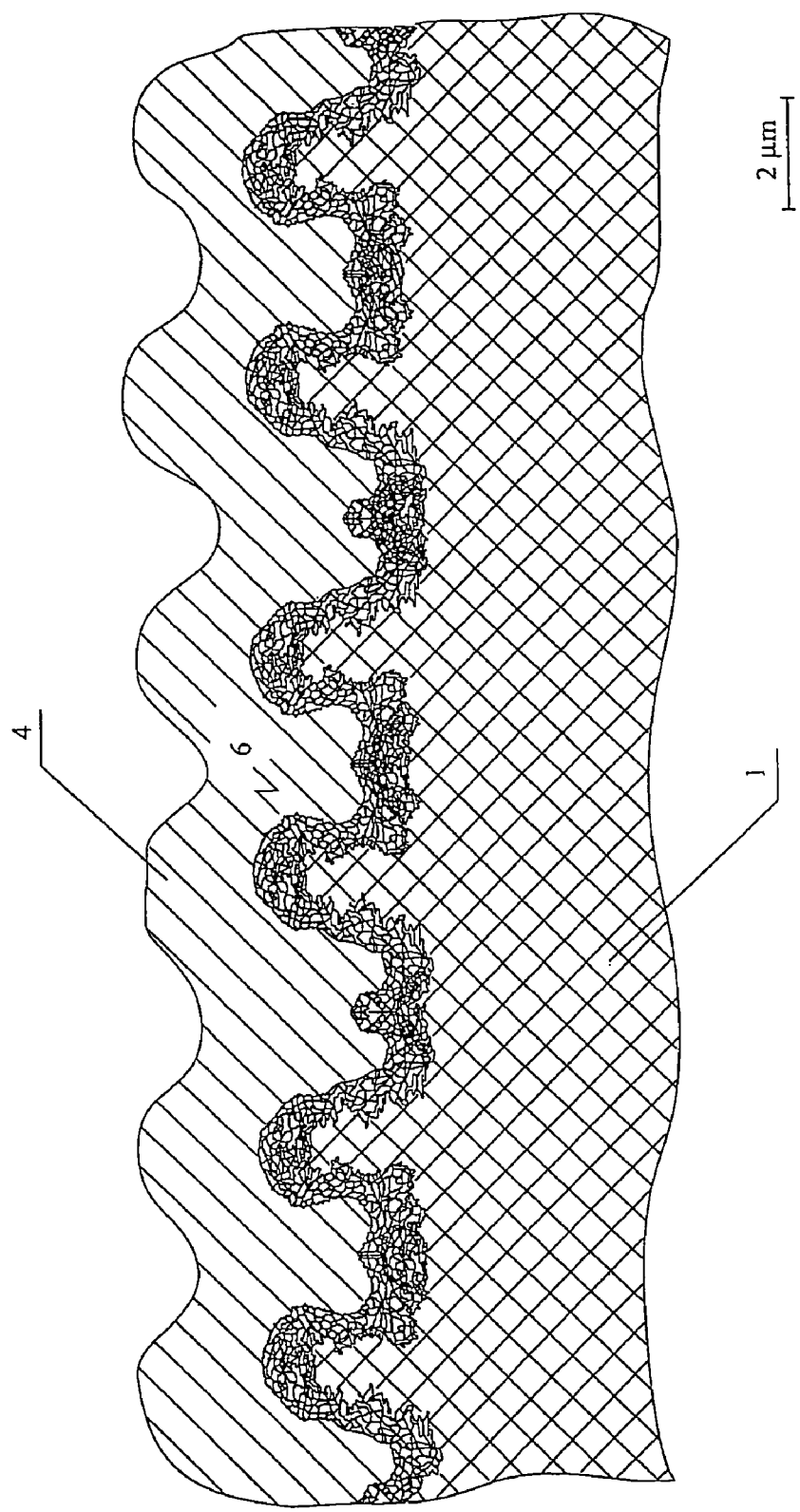
FIG. 3 a cross-section through a PTFE-copper bond with a transition region having a nano-composite.
Figure 4:
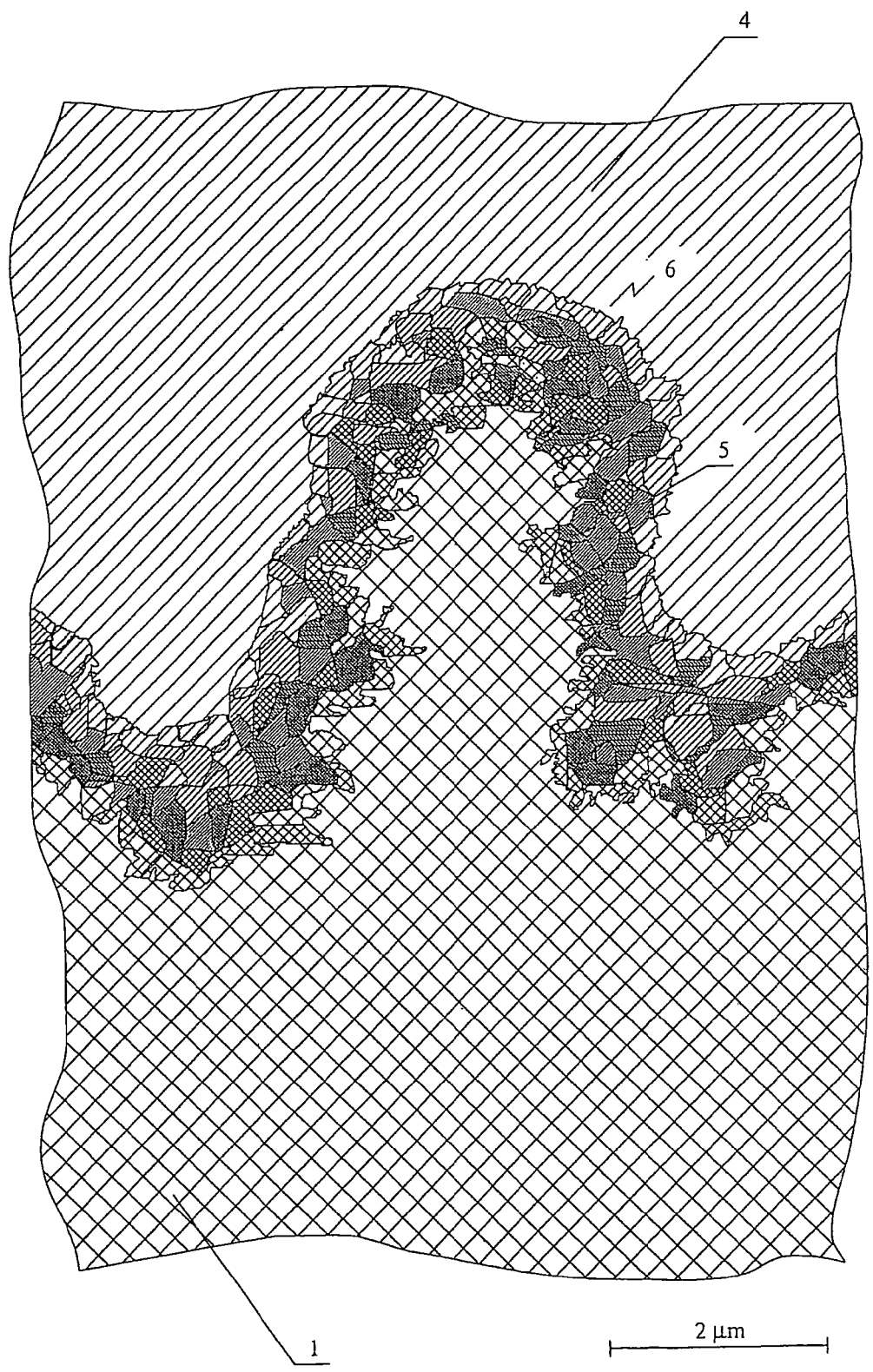
FIG. 4 a detail of the PTFE-copper bond with clearly shown nano-composites in the transition region.

A transition region 6 having a nano-composite 5 consisting of PTFE and copper is thereby produced between the PTFE surface layer of the glass fabric-PTFE composite 1 and the deposited copper layer 4. PTFE transitions stepwise into copper within the transition region 6, i.e., the nano-composites 5 consisting of PTFE and copper have, starting from the PTFE layer 1, an increasingly higher copper fraction until they change over into the metallic copper layer 4. This transition region 6 is illustrated in FIGS. 3 and 4, whereby the concentration of the crosshatched lines of the nano-composites depicted in FIG. 4 illustrates the trend of the material fraction of the respective other material in the nano-composite 5.

The bond produced between the glass fabric-PTFE composite 1 with a PTFE surface layer and the copper 4 in the form of a transition region 6 with a nano-composite 5 consisting of PTFE and copper, whereby the copper fraction in the nano-composites 5 increases from PTFE towards the copper, has an adhesive strength of >1.6 N/mm. The side of the deposited copper layer 4 facing the PTFE 1 has an effective roughness of 1 to 2 µm. The copper layer 4 which is adhesively bonded to the PTFE 1 can subsequently be built up galvanically or chemically to a desired layer thickness of, for example, between 3 and 70 µm.

Example 2

Adhesive Bond Between Polyethylenetheraphtalate (PET) and Aluminum Oxide (this Example is Similarly Shown in FIGS. 1 to 4)

The surface of a polyethylenetheraphtalate (PET) foil 1 was processed in a preceding processing step by scanning ion beam technology and has a nano-indented surface structure 2 with nano cliffs 3, as shown in FIGS. 1 and 2. The PET foil 1 then is moved in a vacuum chamber past an ion beam originating from an ion source with an acceleration voltage of 3 kV and a pressure of $8 \times 10^{-4}$ mbar and is thereby activated. Activation takes place during an effective processing time of approximately 20 seconds. Immediately thereafter, aluminum particles are deposited with a magnetron in an oxygen atmosphere on the activated foil surface which has a nano-indented surface structure 2 with nano-cliffs 3. The aluminum particles are oxidized in the oxygen atmosphere during the deposition predominantly to form aluminum oxide particles. The PET foil 1 is then again moved past the ion source, alternating with the cathode sputtering process. Accordingly, the cathode sputtering process and the ion bombardment alternate with each other, i.e., with a cycle time for each process of approximately 3 seconds, so that the effects of both processes are superimposed to essentially a combined process. After an effective processing time of approximately 20 seconds with alternatingly performing cathode sputtering and ion bombardment, a transition region 6 is formed from the PET substrate 1 to the aluminum oxide 4 with a nano-composite 5 made of PET, aluminum and aluminum oxide. In the transition region 6, the nano-composite 5 changes from a high PET fraction on the side of the transition region 6 facing the PET substrate 1 to nano-composites 5 with a high aluminum oxide fraction on the side of the transition region 6 facing away from the PET substrate 1. Aluminum oxide is then deposited onto this transition region 6 at a pressure of $5 \times 10^{-3}$ to $7 \times 10^{-3}$ mbar by thermal evaporation of aluminum under addition of oxygen, whereby the aluminum oxidizes in the presence of oxygen and is deposited on the surface of the transition region 6 as aluminum oxide. This process continues until the aluminum oxide 4 attains a layer thickness of 10 μm to 20 μm.

The aforedescribed process was used to produce an adhesive bond between polyethylenetheraphtalate (PET) and aluminum oxide 4, which is formed by a transition region 6 with a nano-composite 5 made of PET, aluminum and aluminum oxide.

The invention claimed is:

1. An adhesive bond between
   a substrate material having material having a nano-indented surface and a nano-indented solid region proximate to the surface comprised of polymer compounds with a low active surface energy in a range of fluoropolymers, and
   a second material deposited particle-by-particle on the nano-indented surface of the substrate material while the nano-indented surface of the substrate material is in an energetically excited state, wherein
   a nano-structured transition region comprising nano-composites is formed between the nano-indented substrate material and the second material in such a way that the transition region has a layer thickness between 20 nm and 20 μm and is predominantly formed of nano-composites, and wherein
   a ratio of substrate material to the second material in a direction transverse to the transition region changes from predominantly nano-indented substrate material in an immediate vicinity of the nano-indented substrate material to predominantly the second material in an immediate vicinity of the second material, with the nano-indented substrate material transitioning into the second material with a nano-structure.

2. The adhesive bond according to claim 1, wherein the transition region comprises metal fractions or metal compounds in form of nano composites containing metal polymers.

3. The adhesive bond according to claim 1, wherein the transition region comprises diamond-like components.

4. The adhesive bond according to claim 1, wherein the transition region comprises nano-composites containing fluoropolymers.

5. The adhesive bond of claim 1, wherein the transition region comprises metal polymers.

6. The adhesive bond of claim 1, wherein the transition region comprises nano-composites containing α-C:H.

7. A composite structure comprising
   a substrate material of a first composition having a nano-indented surface and a nano-indented solid region proximate to the surface comprised of a polymer compound with a surface energy in a range of fluoropolymers,
   a second material of a second composition disposed deposited particle-by-particle on the solid region of the nano-indented substrate while the nano-indented substrate is in an energetically exited state, and
   a nano-structured transition region formed between the solid region of the nano-indented substrate and the second material, said nano-structured transition region having a layer thickness between 20 nm and 20 μm and comprising predominantly nano-composites,
   wherein a composition of the nano-composites changes from a composition substantially identical to that of the nano-indented substrate material proximate to the nano-indented substrate material to a composition substantially identical to that of the second material proximate to the second material.

8. The composite structure of claim 7, wherein the nano-composites comprise metal fractions or metal compounds, or both.

9. The composite structure of claim 7, wherein the nano-composites comprise metal polymers.

10. The composite structure of claim 7, wherein the nano-composites have a diamond structure.

11. The composite structure of claim 7, wherein the nano-composites comprise α-C:H.

12. The composite structure of claim 7, wherein the nano-composites comprise fluoropolymers.

* * * * *